Feb. 23, 1960 R. J. EHRET 2,926,307

SERIES ENERGIZED CASCADED TRANSISTOR AMPLIFIER

Filed March 22, 1954

*INVENTOR.*
ROBERT J. EHRET

*BY* Arthur H. Swanson

ATTORNEY.

United States Patent Office 2,926,307

Patented Feb. 23, 1960

2,926,307

SERIES ENERGIZED CASCADED TRANSISTOR AMPLIFIER

Robert J. Ehret, Philadelphia, Pa., assignor to Minneapolis-Honeywell Regulator Company, Minneapolis, Minn., a corporation of Delaware Application March 22, 1954, Serial No. 417,682

6 Claims. (Cl. 330—18)

A general object of the present invention is to provide a new and improved electrical amplifier incorporating transistors or semiconductors as amplifying devices. More specifically, the invention is concerned with the provision of a transistor amplifier which is characterized by its low current drain and by its stability.

It has been found that the voltage ratings of transistors are frequently a limiting factor in designing a useful amplifier circuit. The voltage limitations may arise either in connection with the supply voltages or in connection with the amplified signal voltages and these limitations have presented many practical difficulties to workers in the prior art. It has also been observed that the most practical form of direct current power supply, particularly one derived from an alternating current line, is one having a relatively high voltage and relatively low current drain. In view of the voltage limitations of transistors, it has been found necessary to devise special circuitry when they are to be used with a high voltage supply to insure that the voltage ratings are not exceeded. The present invention provides special circuitry which permits the operation of the transistors in series insofar as the power source is concerned. Such a configuration permits each of the transistors to operate with the same current flow, and, consequently, the circuit components associated with the transistors may be selected to give the optimum of operating characteristics.

Additionally, the circuits of the present invention are well adapted to stabilization in that the base potentials may conveniently be connected to a stabilizing voltage divider which also provides a degenerative feedback path and tends to stabilize each transistor for changes in current flow caused by ambient temperature changes and other temperature changes affecting the characteristics of the transistor. One form of the present invention provides a circuit which achieves a desirably high degree of filtering of the power supply by circuit components which form a part of the amplifier circuit. Another form of the invention permits the obtaining of double the signal voltage obtainable with a single amplifying stage without any accompanying loss of stability and permits a higher useful power output from the amplifier.

It is accordingly a more specific object of the present invention to provide an improved stabilized transistor amplifier wherein the transistors are connected in series to a power supply.

Still another more specific object of the present invention is to provide an improved transistor amplifier wherein the transistors are connected in series to a power supply and the base electrodes of each of the transistors are connected to a single voltage divider also connected across the power supply.

A further more specific object of the present invention is to provide an improved transistor amplifier wherein the signal bypass condensers of the amplifier form a filtering means for any ripple originating in the power supply.

The various features of novelty which characterize the invention are pointed out with particularity in the claims annexed to and forming a part of this specification. For a better understanding of the invention, its advantages, and specific objects attained with its use, reference should be had to the accompanying drawings and descriptive matter in which are illustrated and described preferred embodiments of the invention.

Figures 1, 2, 3:
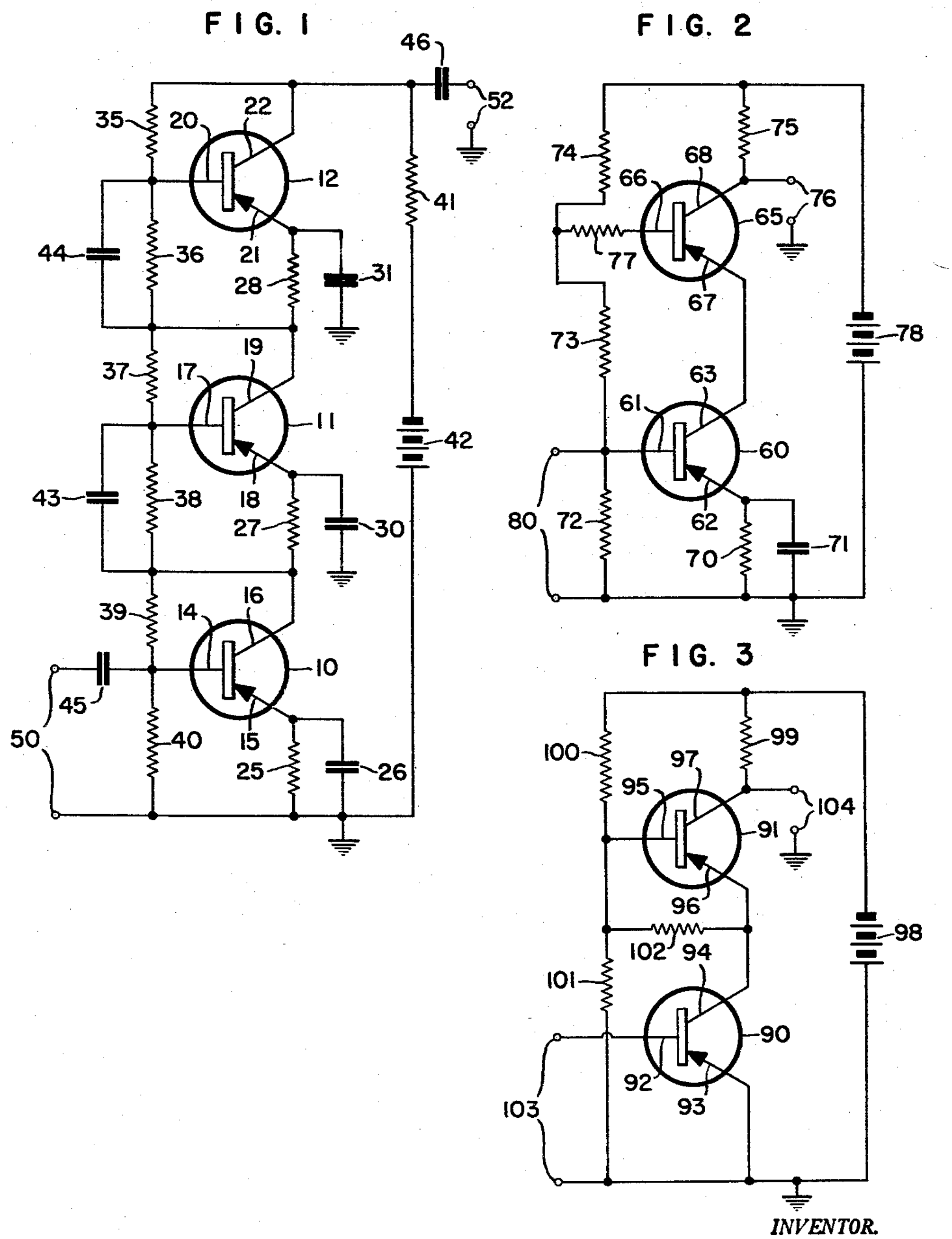
Fig. 1 represents one form of the present apparatus connected as a cascade type of amplifier.
Fig. 2 represents a modified form of the present apparatus connected as a cascade amplifier.
Fig. 3 represents another form of cascade amplifier.

Referring first to Fig. 1, the numerals 10, 11, and 12, represent transistor or semiconductor amplifying devices. The transistor 10 includes a base electrode 14, an emitter electrode 15, and a collector electrode 16. The transistor 11 includes a base electrode 17, an emitter electrode 18, and a collector electrode 19. The transistor 12 includes a base electrode 20, an emitter electrode 21, and a collector electrode 22.

Connected to the emitter electrode 15 is a biasing resistor 25 having a bypass condenser 26 in parallel therewith. Connected to the emitter electrode 18 is an emitter resistor 27. Connected to the emitter electrode 21 is a further emitter electrode resistor 28. The emitter 18 is grounded by way of a bypass condenser 30 while the emitter electrode 21 is grounded by way of a bypass condenser 31.

The base electrodes 14, 17, and 20 are connected to a voltage divider. This voltage divider is comprised of a plurality of resistors 35 through 40 which are connected in series with a load resistor 41 to a suitable direct current power source represented by a battery 42. It is to be understood that the battery 42 may readily be any suitable power supply including a power supply having an alternating current input and a rectified direct current output. The base electrode 14 is connected to the junction between the resistors 39 and 40 while the collector electrode 16 is connected between the junctions of the resistors 38 and 39. In parallel with the resistor 38 is a coupling condenser 43. The base electrode 17 is connected between the junction of resistors 37 and 38 while the collector electrode 19 of the same transistor 11 is connected between the resistors 36 and 37. In parallel with the resistor 36 is a further coupling condenser 44. Also connected to the resistor 36 at its junction with resistor 35 is the base electrode 20. A condenser 45 is connected to the base electrode 14 and serves as a coupling condenser on the input of the amplifier while a further condenser 46 is connected to the load resistor 41 and serves as a coupling condenser on the output of the amplifier.

In considering the operation of Fig. 1, it will first be assumed that there is no alternating current signal on the input of the amplifier. It should be noted that the transistors 10, 11, and 12 are connected in series to the power supply 42. This series circuit may be traced from the positive terminal of the source 42 through resistor 25, emitter 15, collector electrode 16, resistor 27, emitter electrode 18, collector electrode 19, resistor 28, emitter electrode 21, collector electrode 22, and resistor 41 back to the negative terminal of battery 42. Inasmuch as this is a series circuit, the direct current flowing in the last traced circuit will be the same in each of the individual transistors. Consequently, the operating conditions of each of the transistors will be substantially the same insofar as proper selection of operating characteristics are concerned. It will also be noted that the condensers 30 and 31 are connected across this last voltage divider circuit and are effective to filter any ripples originating from the source 42 before they are applied to the low signal amplifying transistor 10. In other words, the source 42 is grounded on its positive terminal so that no signals originating at this end of the power supply will be applied to the transistor 10. The negative terminal reaches the transistor 10 only after the current has had an opportunity to be filtered by the condenser 31 and the condenser 30 cooperating with resistors 28 and 27 as well as the internal resistances of the transistors 12 and 11.

It will also be noted that the power source 42 is connected in series with the base electrode stabilizing voltage divider circuit including the resistors 35 through 40 as well as the resistor 41. This voltage divider will tend to establish on each of the respective base electrodes 14, 17, and 20 a constant direct current potential which will effectively stabilize the operating point of the respective base electrodes. In addition, it will be noted that the collector electrode 16 is connected to the base electrode 14 by way of resistor 39 which resistor provides a degenerative feedback which tends to cause the base electrode 14 to follow any drift change of the collector electrode 16 due to internal temperature changes of the transistor 10. A similar degenerative feedback action will be found in transistor 11 due to the action of the resistor 37 connected between the collector electrode 19 and the base electrode 17. The same degenerative action will be found in transistor 12 wherein the collector electrode 22 is connected by way of resistor 35 to the base electrode 20. In other words, should the average current flow through the transistors 10, 11, and 12 tend to change due to ambient temperature change, the base electrode potentials of the base electrodes 14, 17 and 20 will have applied thereto an appropriate degenerative signal which is effective to minimize the overall current change in the transistors due to the change in ambient temperature. To minimize the degenerative effect on the alternating current signal which is amplified, the resistors 35, 37, and 39 may be selected to be relatively large in size when compared to the size of the resistors in the respective collector electrode circuits.

In considering the operation of Fig. 1 with respect to its amplifying an alternating current signal, it will be presumed that the input terminals 50 are to be connected to a suitable source of alternating current which is to be amplified. The alternating current signal will produce a signal between the base electrode 14 and the emitter electrode 15 by way of the condenser 45, base electrode 14, emitter 15, condenser 26, back to the input terminal 50. This signal will be amplified by the transistor 10 and produce a larger signal across resistor 27 in a circuit that may be traced from the ground terminal through condenser 26, emitter electrode 15, collector electrode 16, resistor 27, and condenser 30 back to the ground terminal.

The voltage drop across resistor 27 is applied to the emitter electrode 18 and to the base electrode 17 of the transistor 11. The circuit to the base electrode 17 is by way of the coupling condenser 43 so that there is effectively a low impedance connection to the base electrode 17. The alternating signal is amplified by the transistor 11 and the alternating current circuit may be traced from the ground terminal through condenser 30, emitter electrode 18, collector electrode 19, resistor 28, condenser 31 back to the ground terminal.

The voltage across resistor 28 is in turn applied to the input of the transistor 12 with the upper end of the resistor 28 being connected to the emitter electrode 21 and the lower end being connected by way of condenser 44 to the base electrode 20. The signal will be in turn amplified and the amplified signal will appear across the load resistor 41. The alternating current circuit for this may be traced from the ground terminal through condenser 31, emitter electrode 21, collector electrode 22, resistor 41, source 42, to ground. With the voltage produced across the resistor 41, the signal will pass through the blocking condenser 46 to the output terminals 52.

Referring now to Fig. 2, numeral 60 represents a transistor having a base electrode 61, an emitter electrode 62, and a collector electrode 63. Also included in the circuit of Fig. 2 is a further transistor 65 comprising a base electrode 66, an emitter electrode 67, and a collector electrode 68. Connected to the emitter electrode 62 is a biasing circuit comprising a resistor 70 with a condenser 71 in parallel therewith. Connected to the base electrode 61 is a resistor 72 which acts with a further resistor 73 and a resistor 74 to stabilize the potentials of the base electrodes 61 and 66. A load resistor 75 is connected to the collector electrode 68 and to one of the output terminals 76. A resistor 77 connects the base electrode 66 to the voltage divider 73—74. Power is supplied to the apparatus of Fig. 2 by way of a suitable power source 78 shown in this figure as a battery.

In considering the operation of Fig. 2, this circuit will be considered first when there is no input alternating signal applied thereto. It should be noted that the transistors 65 and 60 are connected in series to the source 78 by a circuit that may be traced from the positive terminal of the battery 78 through resistor 70, emitter electrode 62, collector electrode 63, emitter electrode 67, collector electrode 68, and resistor 75 back to the negative terminal of the source 78. As with Fig. 1, the current flow through both of the transistors 60 and 65 will be approximately the same and the circuit constants are selected so that this current flow will be of an optimum magnitude to insure satisfactory operation.

It will also be noted that the voltage divider circuit for establishing the base potentials of the transistors 65 and 60 may be traced from the positive terminal of the battery 78 through resistor 72, resistor 73, and resistor 74 back to the negative terminal of the battery 78. With the base electrode 61 connected between the resistors 72 and 73 and the base electrode 66 connected between the resistors 73 and 74, the voltages on these base electrodes will be effectively tied to the power supply and will be fixed in magnitude. This configuration prevents the base electrode potentials from wandering and enhances the general stability of the amplifier.

Insofar as alternating current operation is concerned, it is assumed that an input signal will be applied to the input terminals 80 so that an alternating potential will be applied directly to the base electrode 61 and to the emitter electrode 62 by way of condenser 71. The output of this transistor 60 may be traced from the grounded input terminal through condenser 71, emitter electrode 62, collector electrode 63, emitter electrode 67, collector electrode 68, load resistor 75 and the power source 78 to ground. Since the voltage on the base electrode 66 tends to follow the voltage on the emitter 67, there will also be a signal amplification due to the transistor 65. The alternating current output of the transistor 65 will also appear across the resistor 75 which resistor has one end connected to the upper output terminal 76 and the other end connected to the power supply 78 to ground which is effectively the other output terminal of the output 76.

The presence of the resistor 77 provides for a proper signal balance between transistors 65 and 60 so that the effective output voltages of each of the transistors will be balanced. These signals are added in series and are twice the normal voltage that may be obtained on the output without exceeding the voltage rating of the individual transistors. It will be readily apparent that a number of series connected transistors may be utilized to obtain even higher voltage and power outputs.

Fig. 3 shows a modified form of cascade amplifier similar to that of Fig. 2 except that the degenerative feedback present in Fig. 2 due to the stabilizing voltage divider is eliminated by not connecting the base of the first amplifier stage to the stabilizing voltage divider.

More specifically, the circuit of Fig. 3 comprises a pair of transistors 90 and 91. Transistor 90 comprises a base electrode 92, an emitter electrode 93, and a collector electrode 94. Transistor 91 comprises a base electrode 95, an emitter electrode 96, and a collector electrode 97. Power is supplied to the transistors by a battery 98. A load resistor 99 is connected to the collector electrode 97. For stabilizing the potential of base electrode 95 there is provided a voltage divider including a pair of resistors 100 and 101 connected in series to the battery 98. A resistor 102 serves as a signal balancing means in the circuit.

The circuit of Fig. 3 operates in substantially the same manner as that of Fig. 2. The base electrode bias for base 92 is derived from the base current flowing due to an input signal applied to the input terminals 103. The amplified signal current due to transistor 90 flows through the transistor 91 by way of emitter electrode 96 and collector electrode 97. Since the base electrode 95 will tend to follow the signal on emitter electrode 96, the transistor 91 will also act as an amplifier so that on output terminals 104 there will appear a signal double in voltage magnitude of the amplified signal of the individual stages. The voltage on the base 95 is stabilized by the connection to the voltage divider 100—101 and the voltage may be advantageously set at ½ the supply voltage of battery 98 in a two stage amplifier as shown. The resistor 102 connected to the collector 94 is effective to provide a signal balancing means so that the output signals on transistors 90 and 91 will be of substantially equal magnitude. As with Fig. 2, a number of stages may be connected in series to measure the output voltage available on terminals 104.

While, in accordance with the provisions of the statutes, there have been illustrated and described the best forms of the embodiments of the invention known, it will be apparent to those skilled in the art that changes may be made in the form of the invention as set forth in the appended claims and that in certain cases, certain features of the invention may be used to advantage without a corresponding use of other features.

Having now described my invention, what I claim as new and desire to secure by Letters Patent is:

1. An electrical signal amplifier comprising, a single source of direct current power having two terminals, a plurality of transistor devices each having an emitter, collector, and base electrodes forming transistor input and output circuits, means connecting in series to said two terminals a load resistor and the emitter electrode and collector electrode circuits of all of said transistors, a resistance voltage divider connected to said two terminals, circuit means connecting each of the base electrodes to separate points on said voltage divider, said circuit means including a resistor included in the connection to said voltage divider of the base electrode of the one of said transistors nearest to said load resistor and proportioned to make the output circuit voltages of said transistors substantially equal in magnitude, the one of said separate points on said voltage divider to which the base electrode of the one of said transistors farthest from said load resistor is connected being closer in potential to the emitter of the last mentioned transistor than is the one of said separate points to which the base electrode of said transistor nearest to said load resistor is connected, output terminals connected to the ends of the series connection of said emitter and collector electrode circuits to cause the output circuits of all of said transistors to appear in series between said output terminals and hence to cause an output voltage to be produced therebetween which is the sum of the output circuit voltage across each of said emitter and collector electrode circuits, and an input connection to the input circuit of said one of said transistors farthest from said load resistor.

2. An electrical signal amplifier comprising, a single source of direct current power having two terminals, a plurality of transistor devices each having an emitter, collector and base electrodes forming transistor input and output circuits, means connecting the emitter electrode and collector electrode circuits of all of said transistors in series, a bias resistor connected to the emitter electrode of the first of the series connected transistors, a load resistor connected to the collector electrode of the last of said series connected transistors, means connecting the bias resistor and the load resistor to said two terminals, a resistance voltage divider connected to said two terminals, means connecting the base electrode of each of said transistors to separate points on said voltage divider, the last mentioned means including a resistor included in the connection to said voltage divider of the base electrode of said last transistor and proportioned to make the output circuit voltages of said transistors substantially equal in magnitude, the one of said separate points on said voltage divider to which the base electrode of said first transistor is connected being closer in potential to the emitter of said first transistor than is the one of said separate points to which the base electrode of said last transistor is connected, output terminals connected to the ends of the series connection of said emitter and collector electrode circuits to cause the output circuits of all of said transistors to appear in series between said output terminals and hence to cause an output voltage to be produced therebetween which is the sum of the output circuit voltage across each of said emitter and collector electrode circuits, and an input connection to the input circuit of said first of said series connected transistors.

3. An electrical transistor amplifier comprising a pair of transistors each having a base electrode, an emitter electrode, and a collector electrode, means connecting the collector electrode of one of said transistors to the emitter electrode of the other of said transistors, a two terminal power supply, means connecting the emitter electrode of said one transistor to one of said terminals, means connecting the collector electrode of said other of said transistors through a load resistor to the other of said terminals, a pair of resistors connected in series across said power supply and having the junction between said resistors connected to the base electrode of said other transistor, a further resistor connected between said last mentioned base electrode and the collector electrode of said one transistor, said further resistor being effective to proportion the relative outputs of said transistors in accordance with its value, a first output terminal connected to the collector electrode of said other transistor, a second output terminal connected to the emitter electrode of said one transistor, the outputs of said transistors being connected in series between said terminals to cause an output voltage to be produced between said terminals which is the sum of the output voltage across each of said transistors, and an input connection between the base and emitter electrodes of said one transistor.

4. A transistor amplifier comprising a plurality of transistors each having an emitter electrode, a base electrode and a collector electrode forming transistor input and output circuits, means connecting the emitter-collector electrode paths of all of said transistors in a series circuit to a direct voltage source wherein the last transistor of said series circuit has its collector electrode connected to said source by means of a load resistor, means for establishing a voltage intermediate the voltage of said source comprising a plurality of series connected resistors connected directly to said source, balancing means including balancing resistance means connecting the input circuit of at least said last transistor to said intermediate voltage establishing means and proportioned to make the output circuit voltages of said transistors substantially equal in magnitude, said balancing means including a direct current connection between the base electrode of at least said last transistor and said intermediate voltage establishing means, output terminals connected to the ends of said series circuit of said paths to cause the output circuits of all of said transistors to appear in series between said terminals, whereby there will be produced between said terminals an output voltage which is the sum of the output circuit voltage across each of said transistors, and an input connection to the input circuit of the first transistor of said series circuit.

5. An amplifier as defined in claim 4, wherein the first transistor of said series circuit has its emitter electrode connected directly to the source of voltage.

6. An amplifier as defined in claim 4, wherein said input connection is between the base and emitter electrodes of said first transistor.

References Cited in the file of this patent

UNITED STATES PATENTS

| | | |
|---|---|---|
| 1,985,923 | Gutmann | Jan. 1, 1935 |
| 1,986,597 | Nyman | Jan. 1, 1935 |
| 2,052,986 | Nyman | Sept. 1, 1936 |
| 2,310,342 | Artzt | Feb. 9, 1943 |
| 2,474,435 | Moore | June 28, 1949 |
| 2,666,817 | Raisbeck et al. | Jan. 19, 1954 |

OTHER REFERENCES

French periodical "L'Onde Electrique," 1949, pp. 396–397.

Shea text, "Principles of Transistor Circuits," pp. 120–121, pub. 1953 by John Wiley & Sons, Inc., N.Y.C., pp. 171, 179, 257–260.